United States Patent
Park et al.

(10) Patent No.: US 8,257,839 B2
(45) Date of Patent: Sep. 4, 2012

(54) POLYVINYL PYRROLE HOST MATERIAL, LUMINESCENT LAYER COMPRISING THE SAME, AND ORGANIC ELECTROLUMINESCENT DEVICE COMPRISING THE LUMINESCENT LAYER

(75) Inventors: Jong-Jin Park, Yongin-si (KR); Byoung-Ki Choi, Hwaseong-si (KR); Tae-Yong Noh, Gunpo-si (KR); O-Hyun Kwon, Seoul (KR); Myeong-Suk Kim, Suwon-si (KR); Yu-Jin Kim, Suwon-si (KR); Sang-Heon Hyun, Suwon-si (KR); Boris Aleksandrovich Trofimov, Irkutsk (RU)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 9 days.

(21) Appl. No.: 13/163,915

(22) Filed: Jun. 20, 2011

(65) Prior Publication Data
US 2011/0253993 A1 Oct. 20, 2011

Related U.S. Application Data

(62) Division of application No. 11/588,248, filed on Oct. 27, 2006, now Pat. No. 7,989,569.

(30) Foreign Application Priority Data

Feb. 4, 2006 (KR) .................. 10-2006-0010920

(51) Int. Cl.
*C08F 126/06* (2006.01)
*H01L 51/54* (2006.01)

(52) U.S. Cl. .......... 428/690; 257/40; 257/102; 257/103; 313/504; 420/917; 526/258; 526/259

(58) Field of Classification Search .................. 428/690, 428/917, 411.1, 336; 313/502–509; 257/40, 257/88, 104, E51; 532/1; 526/258
See application file for complete search history.

(56) References Cited

U.S. PATENT DOCUMENTS

| | | | |
|---|---|---|---|
| 7,211,336 B2 * | 5/2007 | Igarashi et al. | 428/690 |
| 7,563,392 B1 | 7/2009 | Hsu et al. | |
| 2003/0205696 A1 | 11/2003 | Thoms et al. | |
| 2006/0063030 A1 * | 3/2006 | Deaton et al. | 428/690 |
| 2006/0083944 A1 * | 4/2006 | Igarashi et al. | 428/690 |

OTHER PUBLICATIONS

Xiaofan Ren et al., "Ultrahigh Energy Gap Hosts in Deep Ble Organic Electrophosphorescent Devices", Chem. Master. 2004, 16, 4743-4747.
M.A. Baldo et al., "Excitonic singlet-triplet ratio in a semiconducting organic thin film", Physical Review B. vol. 60, No. 20, pp. 14 422-14 428, Nov. 15, 1999.
DuBois, C. J.; McCarley R. L. Journal of Electroanalytical Chemistry 454 (1998) 99-105.
Ruggeri, G.; Spila, E.; Puncioni, G.; Ciardelli, F. Macromol. Rapid Commun. 15, 537-542 (1994).

* cited by examiner

*Primary Examiner* — Jennifer Chriss
*Assistant Examiner* — J. L. Yang
(74) *Attorney, Agent, or Firm* — Robert E. Bushnell, Esq.

(57) ABSTRACT

Provided are a polyvinyl pyrrole host material emitting highly efficient phosphorescence, a luminescent layer using the material, and an organic electroluminescent display device. The polyvinyl pyrrole host material shows highly efficient luminescence having improved energy transfer, and thus is useful for an organic electroluminescent display device and other various light emitting devices.

20 Claims, 5 Drawing Sheets

POLYVINYL PYRROLE HOST MATERIAL, LUMINESCENT LAYER COMPRISING THE SAME, AND ORGANIC ELECTROLUMINESCENT DEVICE COMPRISING THE LUMINESCENT LAYER

CROSS-REFERENCE TO RELATED PATENT APPLICATION AND CLAIM OF PRIORITY

This application claims the benefit of Korean Patent Application No. 10-2006-0010920, filed on Feb. 4, 2006 in the Korean Intellectual Property Office, the disclosure of which is incorporated herein in its entirety by reference. Furthermore, this application is filed pursuant to 35 U.S.C. §121 as a Divisional application of Applications ' patent application Ser. No. 11/588,248 filed in the U.S. Patent & Trademark Office on 27 Oct. 2006, and assigned to the assignee of the present invention. All benefits accruing under 35 U.S.C. §120 from the aforesaid present application Ser. No. 11/588,248 are also claimed.

BACKGROUND OF THE INVENTION

1. Field of the Invention

The present invention relates to a polyvinyl pyrrole host material, a luminescent layer including the same, and an organic electroluminescent display device including the luminescent layer, and more particularly, to a polyvinyl pyrrole host material which has improved energy transfer, a luminescent layer including the same, and an organic electroluminescent display device including the luminescent layer with improved efficiency.

2. Description of the Related Art

An organic electroluminescent display device is a self-emissive display device using the principle that when a current is applied to a fluorescent or phosphorescent organic compound thin layer, electrons and holes combine in an organic layer and thus light is generated. The organic electroluminescent display device is lightweight and has simple elements, and the manufacturing process thereof is straightforward, providing high, quality images and a wide viewing angle. Also, the organic electroluminescent display device can provide high color purity and realize perfect mobile images and is operated at a low power and a low driving voltage, which are appropriate properties for mobile electronic equipment.

Generally, an organic electroluminescent display device includes an anode formed on a substrate, and a hole transporting layer, a luminescent layer, an electron transporting layer, and a cathode are sequentially formed on the anode. The hole transporting layer, the luminescent layer, and the electron transporting layer are organic layers formed of organic compounds. The above described organic electroluminescent display device operates as follows. When a voltage is applied between the anode and the cathode, holes injected from the anode migrate via the hole transporting layer to the luminescent layer. The electrons are injected from the cathode via the electron transporting layer to the luminescent layer, and carriers are recombined in the area of the luminescent layer to generate excitons. The excitons radioactively decay and thus light at a wavelength corresponding to a band gap of the material is emitted.

The material forming the luminescent layer of the organic electroluminescent display device can be classified into a fluorescent material using singlet excitons and a phosphorescent material using triplet excitons according to the light emitting mechanism. Such fluorescent materials or phosphorescent materials are used by themselves or doped in an appropriate host material to form a luminescent layer, and as a result of electron excitation, singlet excitons and triplet excitons are formed in a host. The statistical ratio of the singlet excitons and the triplet excitons is 1:3 (Baldo, et al., Phys. Rev. B, 1999, 60, 14422).

When the luminescent layer of the organic electroluminescent display device is formed of a fluorescent material, triplet excitons generated in the host are wasted, whereas when the luminescent layer is formed of phosphorescent material, both singlet and triplet excitons can be used and thus the internal quantum efficiency may reach 100%. Accordingly, when formed of a phosphorescent material, the luminescent layer can have much higher luminous efficiency than when formed of a fluorescent material.

Also, the material forming the luminescent layer can be classified into a luminescent material used alone and a light emitting material employing a host/dopant light emitting system. Recently, M. E. Thompson reported in Chem. Mat. 16,4743 (2004) an excellent result of a derivative including silicon and having a very wide gap energy that is used as a host for a blue light emitting material compared to a light emitting material used alone.

The light emitting material used alone has problems such as forming excimers by interaction between molecules and reduction in color purity and efficiency. The host/dopant light emitting system has improved color purity compared to the light emitting material used alone and can achieve an increase in efficiency by energy transfer. However, a new host material with improved energy transfer is still required to manufacture a high efficiency light emitting device.

SUMMARY OF THE INVENTION

The present invention provides a polyvinyl pyrrole host material with improved energy transfer.

The present invention also provides a luminescent layer including the polyvinyl pyrrole host material.

The present invention also provides an organic electroluminescent display device including the luminescent layer.

According to an aspect of the present invention, there is provided a polyvinyl pyrrole host material represented by Formula 1 below:

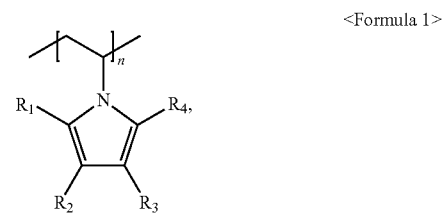

<Formula 1> where $R_1$, $R_2$, $R_3$, and $R_4$ are each independently a hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group, and two of these can be fused to form a fusion ring of 5 to 7 circles, and n is an integer from 10 to 10,000.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
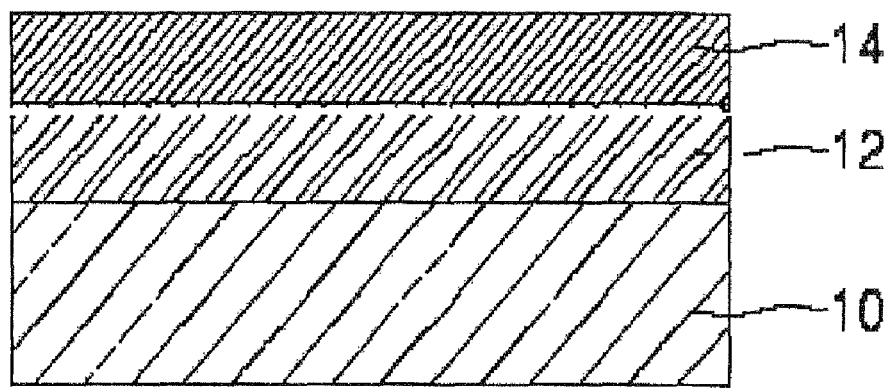
FIGS. 1A through 1F schematically illustrate a stack structure of an organic electroluminescent display device according to an embodiment of the present invention.

The present invention will now be described more fully with reference to the accompanying drawings, in which exemplary embodiments of the invention are shown.

The present invention provides a polyvinyl pyrrole host material represented by Formula 1 below which facilitates energy transfer in the light emitting mechanism of a host/dopant light emitting system by being used in combination with a dopant, thereby improving the luminous efficiency.

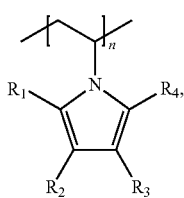

<Formula 1> where $R_1$, $R_2$, $R_3$, and $R_4$ are each independently a hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_1$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group. Two of these can be fused to form a fusion ring of 5 to 7 circles.

N is an integer from 10 to 10,000.

Generally, energy is efficiently transferred when the singlet energy level $S^H_0$ of the host is lower than the singlet energy level $S^D_0$ of the dopant, and the triplet energy level $T^H_1$ of the host is higher than the triplet energy level $T^D_1$ of the dopant. Also, preferably, the light emitting area of the host material overlaps with the absorption area of the dopant material, and the host material and the dopant material do not create condensation and have high thermal stability.

The above described polyvinyl pyrrole host material represented by Formula 1 has an improved luminous efficiency due to good miscibility between molecules and a good coating characteristic when emitting light under the light emitting mechanism under the above-described host/dopant light emitting system.

According to an embodiment of the present invention, the compound of Formula 1 may be a polymer where a hydrogen atom present in the pyrrole in the center of the polymer is substituted with a substituted or unsubstituted phenyl group, as represented in Formula 2 or 3 below.

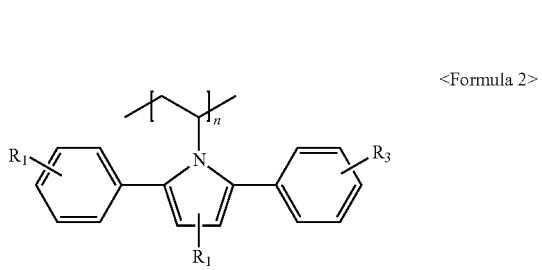

<Formula 2>

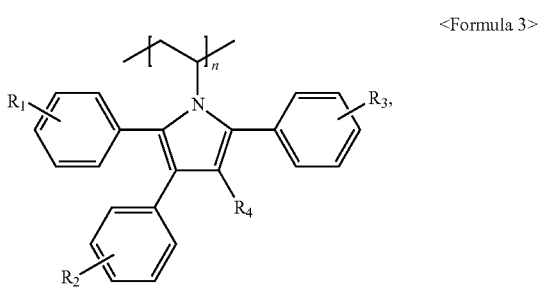

<Formula 3> where $R_1$, $R_2$, and $R_3$ are at least one substitution groups on the rings, and are each independently a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ aryl alkyl group, a substituted or unsubstituted $C_5$-$C_{30}$ heteroaryl group, or a substituted or unsubstituted $C_3$-$C_{30}$ heteroarylalkyl group, and $R_4$ is a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group, and n is an integer from 10 to 10,000.

According to an embodiment of the present invention, the compound according to Formula 1 can be a polymer where a hydrogen atom in pyrrole in the center of the polymer is substituted with a substituted or unsubstituted anthracenyl group, as represented in Formulas 4 through 6.

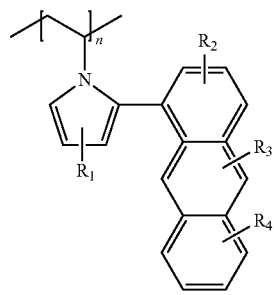
<Formula 4>

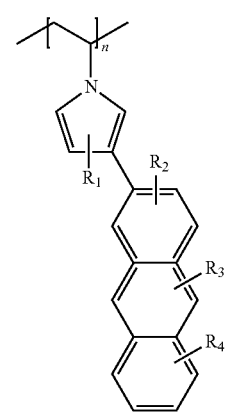
<Formula 5>

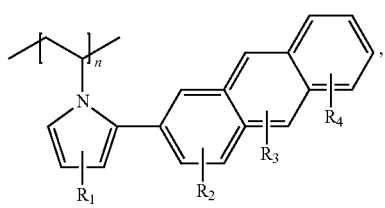
<Formula 6> where $R_1$, $R_2$, $R_3$, and $R_4$ are at least one substitution groups on the rings, and are each independently a hydrogen, a halogen atom, a carboxyl group, an amino group, a nitro group, a cyano group, a substituted or a unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group, and n is an integer from 10 to 10,000.

According to an embodiment of the present invention, the compound according to Formula 1 can be a polymer where two or more hydrogen atoms in pyrrole in the center of the polymer are substituted with a fusion ring, as represented in Formulas 8 through 10.

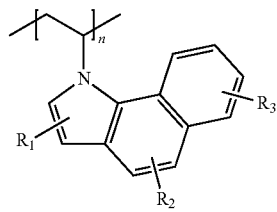
<Formula 8>

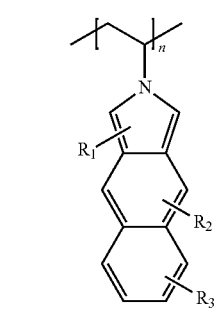
<Formula 9>

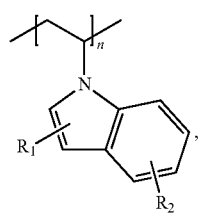
<Formula 10> where $R_1$, $R_2$, and $R_3$ are at least one substitution groups on the rings, and are each independently a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_2$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group, and n is an integer from 10 to 10,000.

According to an embodiment of the present invention, compound according to Formula 1 above can be a polymer where a hydrogen atom in pyrrole in the center of the polymer is substituted with a carbazolyl group, as represented by Formulas 11 and 12.

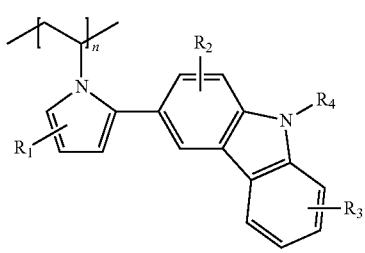
<Formula 11>

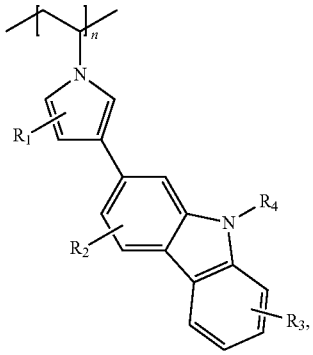

<Formula 12>

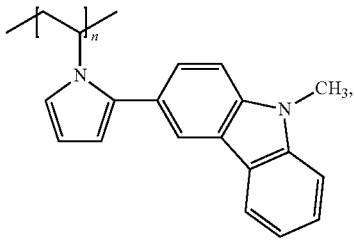

<Formula 14> wherein n is an integer from 10 to 10,000.

The above described polyvinyl pyrrole host material as in Formula 1, for example, the polyvinyl host material of Formulas 2 through 14 show improved luminous efficiency by improved energy transfer and thus can be used in the luminescent layer of various light emitting devices, and particularly can be used as a luminescent layer in an organic electroluminescent display device.

When the polyvinyl pyrrole host material of Formula 1 according to an embodiment of the present invention is employed in the luminescent layer, the amount of the polyvinyl pyrrole material may be 70-99% by weight of the total amount of the light emitting material in the luminescent layer. If the amount is less than 70% by weight, triplet excitons are quenched, thus decreasing efficiency. If the amount is greater than 99% by weight, the light emitting material becomes insufficient and thus the efficiency and life span decrease.

As described above, the polyvinyl pyrrole host material of Formula 1 according to an embodiment of the present invention can be employed with a dopant material to form a host/dopant light emitting system.

where $R_1$, $R_2$, and $R_3$ are at least one substitution groups on the rings, and are each independently a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ aryl alkyl group, a substituted or unsubstituted $C_5$-$C_{30}$ heteroaryl group, or a substituted or unsubstituted $C_3$-$C_{30}$ heteroarylalkyl group, and $R_4$ is a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group, and n is an integer from 10 to 10,000.

According to an embodiment of the present invention, the compound of Formula 1 may be preferably the compound of Formula 13 or 14 below.

Examples of the dopant materials include a phosphorescent dopant, for example, an iridium based complex such as bisthienylpyridine acetylacetonate Iridium, bis(benzothienylpyridine)acetylacetonate Iridium, bis(2-phenylbenzothiazole)acetylacetonate Iridium, bis(1-phenylisoquinoline)Iridium acetylacetonate, tris(1-phenylisoquinoline)Iridium or tris(2-phenylpyridine)Iridium (Ir(ppy)$_3$), or an europium complex such as tris(theotyltrifluoroacetonate)europium (Eu(TTA)$_3$), (1,10-phenanthroline)-tris(4,4,4-trifluoro-1-(2-thienyl)butane-1,3-dionate)europium (Eu(TTA)$_3$phen), tris(dibenzoylmethanato)phenanthroline europium (Eu(DBM)$_3$(Phen)), or (4,7-diphenyl phenanthroline)-tris(4,4,4,-trifluoro)-1-(2-thienyl)-butane-1,3-dionate europium (Eu(TTA)$_3$bath), tris(4-methylbenzoate lanthanide) (La(MeB)$_3$), or tris(4-methoxy benzoyl benzoate)lanthanide (La(MeOBB)$_3$). Also, tris(4,7-diphenyl-1,10-phenanthroline)ruthenium(II)perchlorate, tris(hexafluoroacetylacetonate) mono(1,10-phenanthroline)erbium(III), bis(2-methyl-8-hydroxy quinolinato)zinc, 1,4-bis[9-ethyl-3-carbazovinylene)-2-methoxy-5-(2-ethylhexyloxy)benzene, 1-(2,2-diphenylethen-1-yl)pyrene, tris(8-hydroxyquinolato)aluminum, and 4,4'-bis[4-(di-p-tolylamino)styryl]biphenyl can be used.

The amount of the dopant may be approximately 1 to 30% by weight of the total amount of the light emitting material. If the amount of the dopant is less than 1% by weight, the luminous efficiency may decrease, and if the amount is greater than 30%, the amount of the host material may decrease which decreases the luminous efficiency.

The luminescent layer including the polyvinyl pyrrole host material of Formula 1 may further include one or more materials selected from the group consisting of a polymer host, a mixed host of polymer and a small molecule, small molecule host, and a non-light emitting polymer matrix. Here, an ordi-

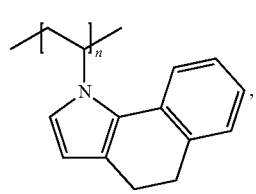

<Formula 13> wherein n is an integer from 10 to 10,000.

nary polymer host, a small molecule host, and a non-light emitting polymer matrix used for forming a luminescent layer of an organic electroluminescent display device can be used. Examples of the polymer host materials are PVK and PF, and examples of the small molecule host include CBPs (4,4'-N, N'-CBP), 4,4'-bis[9-s(3,6-biphenyl carbazolyl)]-1-1,1'-biphenyls [4,4'-bis[9-s]-1-1,1'-biphenyl]s, 9,10-bis [(2',7'-tertial-butyl)-9',9"-spirobifluorenyl anthracene, tetrafluorene, and examples of the non-light emitting polymer matrix include polymethyl methacrylate, polystyrene, etc., but is not limited thereto.

The luminescent layer including the polyvinyl pyrrole host material of Formula 1 according to an embodiment of the present invention can be applied to various light emitting devices and may be applied particularly to an organic electroluminescent display device.

The organic electroluminescent display device according to an embodiment of the present invention includes a luminescent layer which is formed using a polyvinyl pyrrole host material represented by Formula 1. The polyvinyl pyrrole host material represented by Formula 1 is very useful as a phosphorescent host material and, though depending on the dopant, shows good luminescence in the blue wavelength region.

FIGS. 1A through 1F illustrate a stack structure of an organic electroluminescent display device according to embodiments of the present invention.

Referring to FIG. 1A, a luminescent layer 12 including the polyvinyl pyrrole host of Formula 1 is stacked on a first electrode 10 and a second electrode 14 is formed on the luminescent layer 12.

Figure 1B:
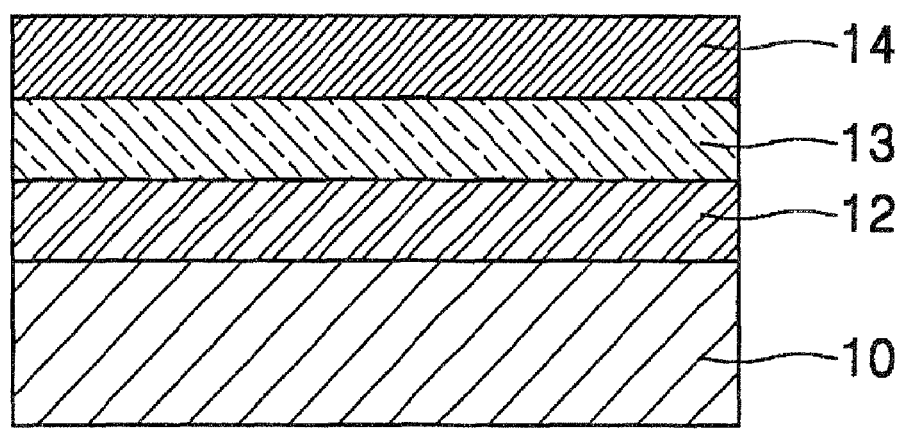

In FIG. 1B, a luminescent layer 12 including the polyvinyl pyrrole host of Formula 1 is stacked on a first electrode 10 and a hole blocking layer (HBL) 13 is formed on the luminescent layer 12, and a second electrode 14 is formed on the hole blocking layer (HBL) 13.

Figure 1C:
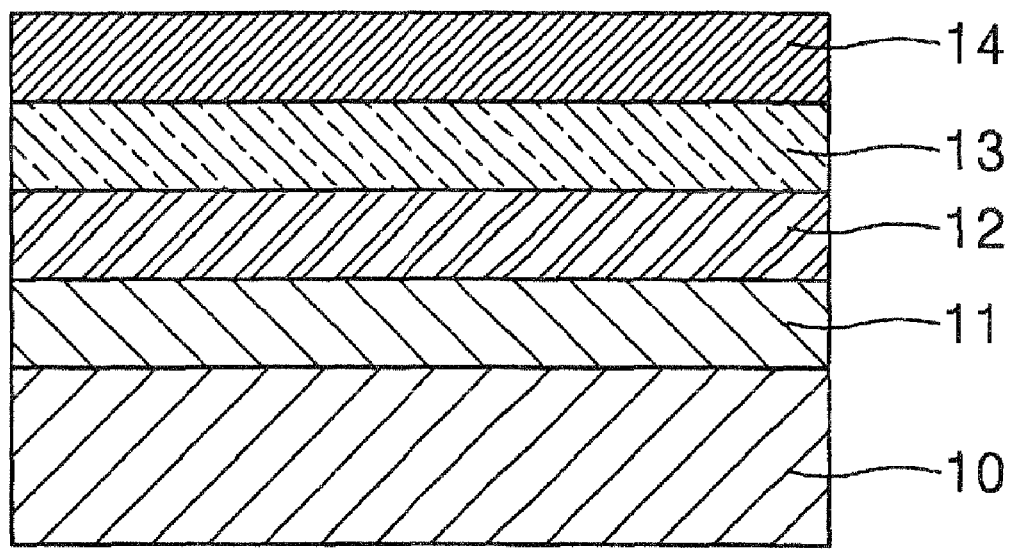
Figure 1D:
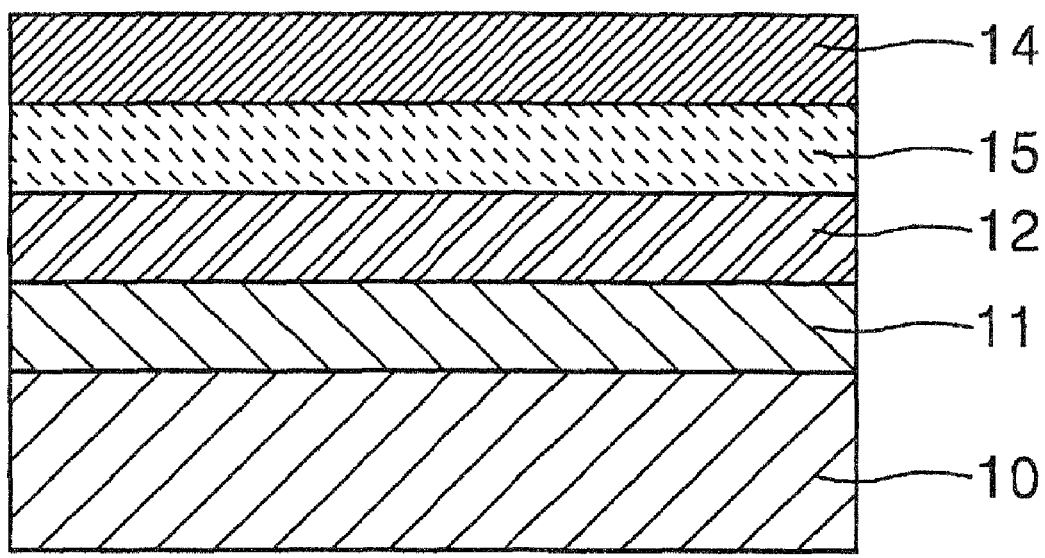

In the organic electroluminescent display device in FIG. 1C, a hole injection layer 11 is disposed between the first electrode 10 and the luminescent layer 12 including the polyvinyl pyrrole host.

The organic electroluminescent display device of FIG. 10 has the same stack structure as in FIG. 10, except that an electron transporting layer (ETL) 15 is formed instead of an HBL 13 formed on the luminescent layer 12 including the polyvinyl pyrrole host of Formula 1.

Figure 1E:
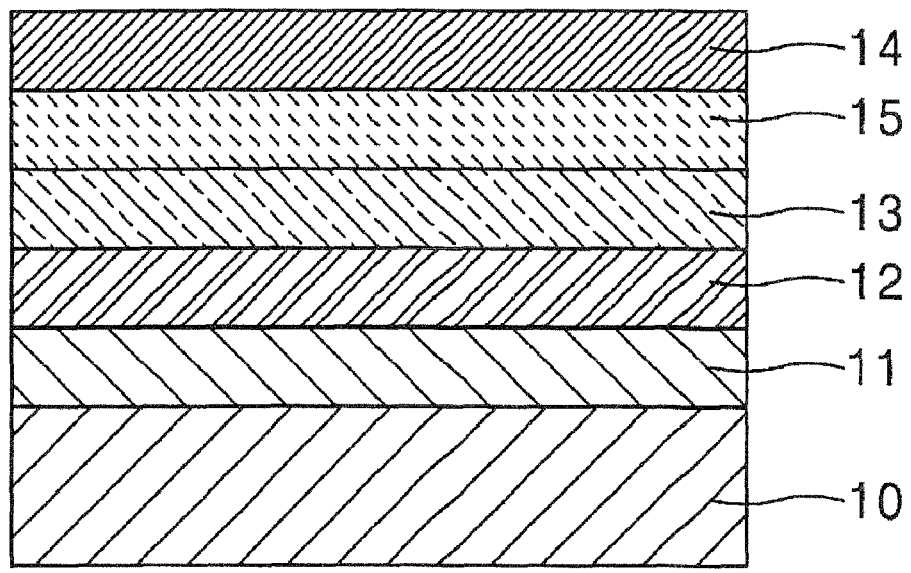

The organic electroluminescent display device in FIG. 1E has the same stack structure as in FIG. 10 except that a two-layered stack formed of an HBL 13 and an electron transporting layer 15 is used instead of the HBL 13 formed on the luminescent layer 12 including the polyvinyl pyrrole host of Formula 1. In some cases, an electron injection layer may be further disposed between the electron transporting layer 15 and the second electrode 14 in the organic electroluminescent display device in FIG. 1E.

Figure 1F:
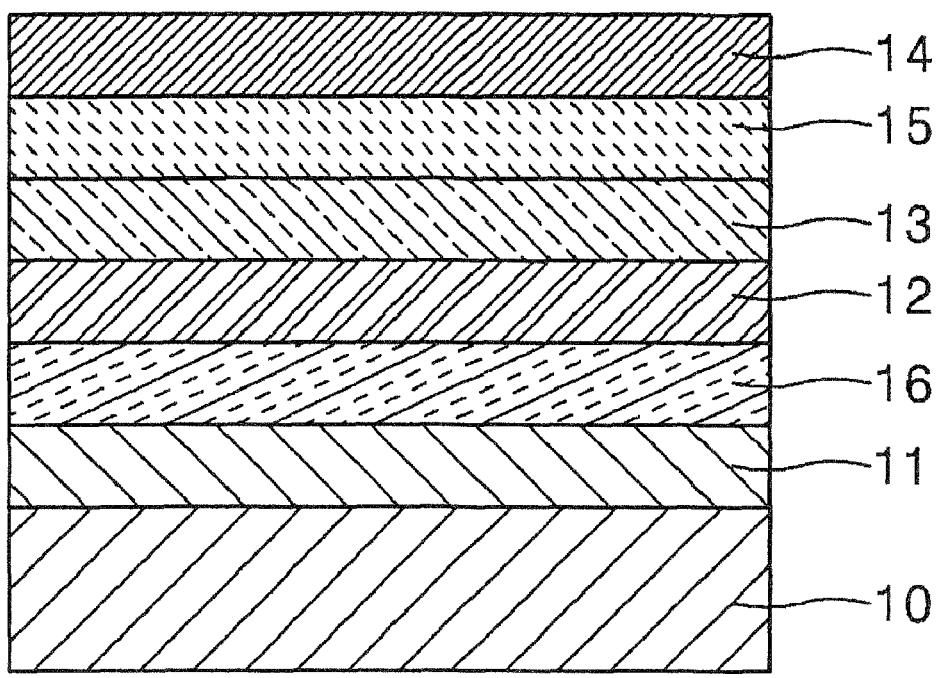

The organic electroluminescent display device in FIG. 1F has the same structure as in FIG. 1E, except that a hole transporting layer 16 is further included between the hole injection layer 11 and the luminescent layer 12 including the polyvinyl pyrrole host of Formula 1. The hole transporting layer 16 blocks injection of impurities from the hole injection layer 11 to the luminescent layer 12.

The organic electroluminescent display device having the above described stack structure can be formed in the conventional manner and the method of manufacturing thereof is not limited.

The thickness of the luminescent layer may be 30 to 100 nm. If the thickness of the luminescent layer is less than 30 nm, the efficiency and life span of the organic electroluminescent display device decrease. If the thickness of the luminescent layer is over 100 nm, the driving voltage increases.

The luminescent layer including the polyvinyl pyrrole host of Formula 1 may also function as an electron transporting layer or a hole transporting layer.

A buffer layer may be formed between the electrode and the luminescent layer, between the electrode and the electron transporting layer, or between the electrode and the hole transporting layer. The buffer layer can be formed of a conventionally used material, and examples of the buffer layer include, but are not limited to, copper phthalocyanine, polythiophene, polyaniline, polyacetylene, polypyrrole, polyphenylene vinylene, and derivatives thereof.

The material of the hole transporting layer 16 may be a conventionally used material such as aryl amine-based material, preferably carbazole-based material, but are not limited thereto. The carbazole-based material may be one or more selected from the group consisting of 1,3,5-triscarbazolylbenzene, 4,4'-biscarbazolylbiphenyl (CBP), polyvinylcarbazole, m-biscarbazolylphenyl, 4,4'-biscarbazolyl-2,2'-dimethylbiphenyl (dmCBP), 4,4',4"-tri(N-carbazolyl) triphenylamine, 1,3,5-tris(2-carbazolylphenyl)benzene, 1,3, 5-tris(2-carbazolyl-5-methoxyphenyl)benzene, and bi(4-carbazolylphenyl)silane.

The electron transporting layer can be formed of a conventionally used material, and preferable examples of the material include one or more compounds selected from the group consisting of an organic metal complex including a metal and an organic ligand, an oxadiazole based compound, a phenanthroline compound, a triazine compound, and a triazole compound.

An unlimited example of the organic metal complex may be one or more materials selected from the group consisting of bis(8-hydroxyquinolato)biphenoxy metal, bis(8-hydroxyquinolato)phenoxy metal, metal(bis(2-methyl-8-hydroxyquinolato)biphenoxy metal), (bis(2-methyl-8-hydroxyquinolato)phenoxy metal), bis(2-methyl-8-quinolinolato) (para-phenyl-phenolato)metal), and (bis(2-(2-hydroxyphenyl)quinolato)metal), and the metal is aluminum, zinc, beryllium, and gallium.

The electron transporting material may be bis(8-hydroxyquinolato)biphenoxy aluminum, bis(8-hydroxyquinolato) phenoxy aluminum, bis(2-methyl-8-hydroxyquinolato)biphenoxy aluminum, bis(2-methyl-8-hydroxyquinolato) phenoxy aluminum, bis(2-methyl-8-quinolinolato)(paraphenyl-phenolato)aluminum(BAlq), or bis(2-(2-hydroxy phenyl)quinolato)zinc.

The spirofluorene compound has two connection rings between the two spirofluorenes and the connection can be substituted with triazole, oxadiazole, naphthalene, anthracene, or phenyl, and the no. 9 position of each fluorene may be substituted with O, S, Se, N—R, or P—R, or N—R or P—R may connect two spirofluorenes to each other. R is respectively H or a substitution group selected from the group consisting of a $C_1$-$C_{20}$ alkyl group, a $C_5$-$C_{20}$ aryl group having a $C_1$-$C_{20}$ alkyl group, a $C_2$-$C_{20}$ heteroaryl group, and a $C_6$-$C_{20}$ aryl group having a $C_1$-$C_{20}$ alkoxy group. The spirofluorene compound is preferably 2,5-dispirobifluorene -1,3,4-oxadiazole.

Examples of the oxadiazole based compound are (4-biphenylyl)-5-(4-tert-butyl phenyl)-1,3,4-oxadiazole, etc., and examples of the phenanthroline compound are 2,9-dimethyl-4,7-diphenyl-9,10-phenanthroline (BCP), etc. Examples of the triazine compound include 2,4,6-tris(diphenylamino)-1, 3,5-triazine, 2,4,6-tricarbazole, 1,3,5-triazine, 2,4,6-tris(N-phenyl-2-naphthylamino)-1,3,5-triazine, 2,4,6-tris(N-phenyl-1-naphthylamino)-1,3,5-triazine, etc. Examples of the triazole compound include 3-phenyl-4-(1'-naphthyl)-5-phenyl-1,2,4-triazole, etc.

Examples of the HBL include conventionally used materials, and may be preferably LiF, $BaF_2$ or $MgF_2$, but are not limited thereto.

In order to increase the efficiency and the lifespan of the organic electroluminescent display device, the layers may be formed of a mixed material or layers having additional functions may be introduced. In addition, the number of the layers may be reduced using a material having multiple functions in order to simplify the manufacturing of the device.

The organic electroluminescent display device according to an embodiment of the present invention does not require any particular apparatus or method, and can be manufactured by a method of manufacturing an organic electroluminescent display device using a conventional light emitting material.

Light emitting diodes using the host materials as described above can be used in full color display light source illumination, a backlight, an outdoor bulletin board, optical communications, or interior design.

Hereinafter, the present invention will be described in detail with reference to the following examples. The following examples are for illustrative purposes only and are not intended to limit the scope of the invention.

EXAMPLE 1

Synthesis of poly(1-vinyl indole)

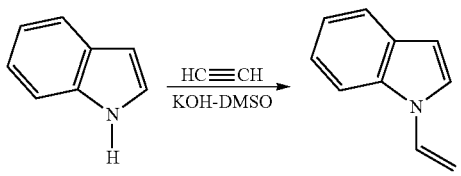

<Equation 1>

As represented by Equation 1, indole was vinylated with acetylene at about 95-97° C. for 7 hours in a base system using KOH-DMSO (dimethyl sulfoxide) as represented in Equation 1 to obtain 1-vinyl indole as a transparent fluid colorless liquid at a yield of 43%.

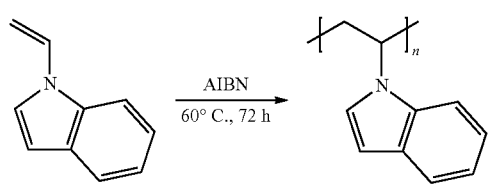

<Equation 2>

As represented in Equation 2, 1-vinyl indole obtained from Equation 1 was radically polymerized with azobisisobutylonitryl (AIBN) at 60° C. for 72 hours to obtain poly(1-vinyl indole) having a molecular weight of 3,800 as white powder at a yield of 75%.

EXAMPLE 2

Synthesis of poly(1,4-bis[2-(1-vinyl)pyrrolyl]benzene)

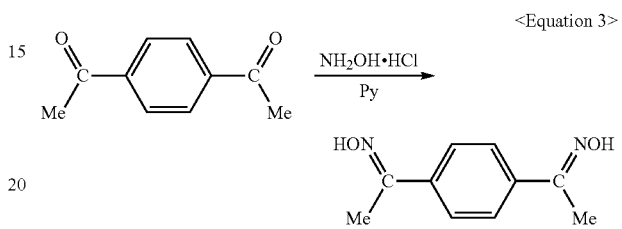

<Equation 3>

As represented in Equation 3, hydroxyl amine hydrochloride and 1,4-diacetylenebenzene were reacted in a pyridine (py) solvent at 80° C. for 2 hours to obtain 1,4-diacetylbenzene oxime as white powder at a yield of 95%.

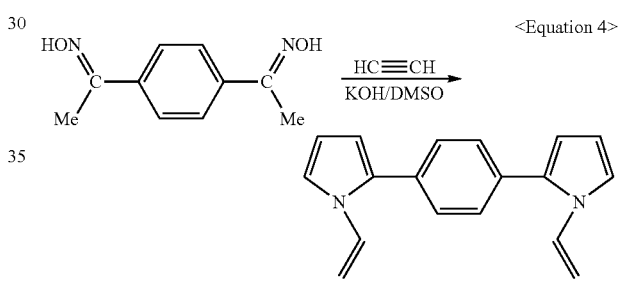

<Equation 4>

As represented in Equation 4, acetylene and 1,4-diacetylbenzene dioxime 1,2-bis-[2-(1-vinyl)pyrrolyl]benzene was obtained as a white crystal at a yield of 15% in KOH-DMSO base system.

The obtained 1,4-bis-[2-(1-vinyl)pyrrolyl]benzene was radically polymerized in the presence of AIBN at 70° C. for 165 hours to obtain poly(1,4-bis[2-(1-vinyl)pyrrolyl]benzene) having a molecular weight of 1100 at a yield of 33%.

EXAMPLE 3

Synthesis of poly(1-vinyl-4,5-dihydrobenzo[g]indole)

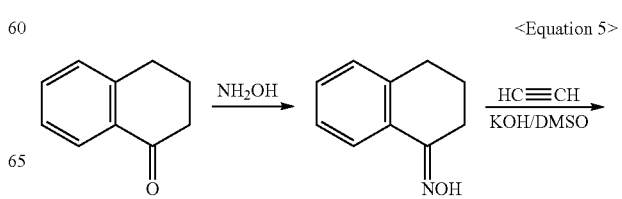

<Equation 5>

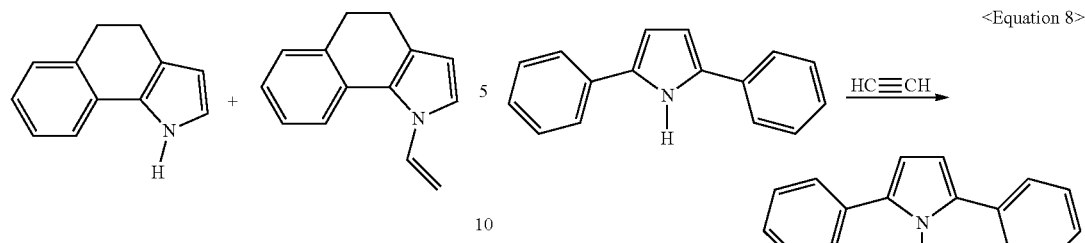

Hydroxyl amine and 1-tetrarone were reacted at 70° C. for 2 hours in DMSO, and then reacted with acetylene in a KOH-DMSO base system to manufacture 4,5-dihydrobenzo[g]indole and 1-vinyl-4,5-dihydrobenzo[g]indole at a yield of 45% and 21%, respectively.

<Equation 6>

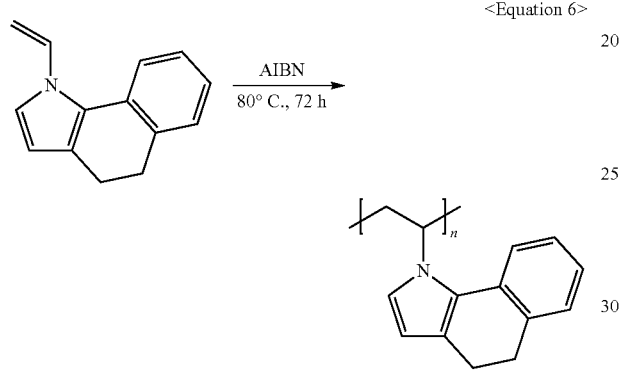

As represented in Equation 6, 1-vinyl-4,5-dihydrobenzo[g]indole was radically polymerized at 80° C. for 72 hours in the presence of AIBN to synthesize poly(1-vinyl-4,5-dihydrobenzo[g]indole) with a molecular weight of 1,500 as light brown powder at a yield of 5%.

EXAMPLE 4

Synthesis of poly(1-vinyl-2,5-diphenylpyrrole)

<Equation 7>

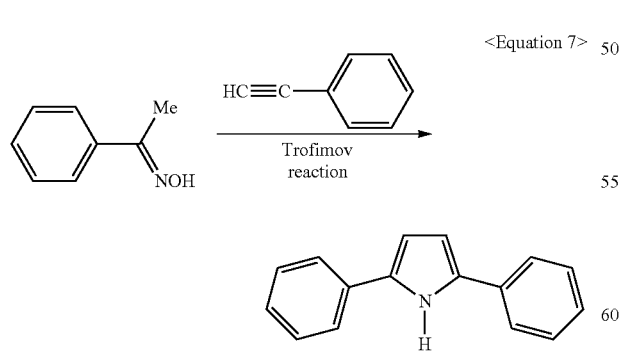

As represented in Equation 7, 2,5-diphenyl pyrrole at a yield of 17% was synthesized by Trofimov reaction of 1-phenyl ethanone oxime in KOH/DMSO base system in the presence of ethynyl-benzene at 160° C. for 6 hours.

<Equation 8>

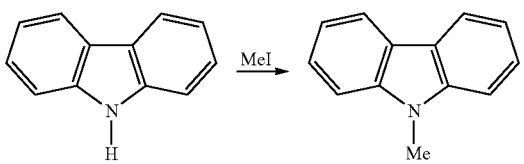

As represented in Equation 8, 2,5-diphenyl pyrrole was reacted with acetylene at 150° C. for 3 hours in a KOH/DMSO base system to manufacture 1-vinyl-2,5-diphenyl pyrrole at a yield of 75%.

The obtained 1-vinyl-2,5-diphenyl pyrrole was pressurized and radically polymerized at 65° C. for 15 hours in the presence of AIBN to manufacture poly(1-vinyl-2,5-diphenyl pyrrole) having a molecular weight of 2,300 at a yield of 37%.

EXAMPLE 5

Synthesis of poly(9-methyl-3-(1-vinylpyrrole-2-il)carbazole)

<Equation 9>

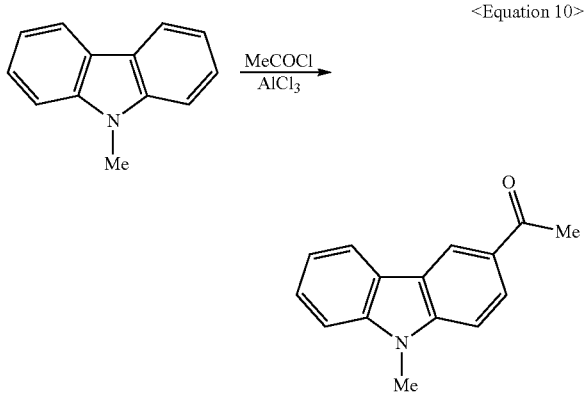

As represented in Equation 9, carbazole was reacted with methyl iodide at 20° C. for 5 hours in a KOH/DMSO base system to synthesize 9-methyl carbazole at a yield of 95%.

<Equation 10>

As represented in Equation 10, 9-methyl carbazole was reacted with MeCOCl at 10° C. for 7 hours in the presence of CHCl$_3$ and AlCl$_3$ to manufacture 1-(9-methyl carbazole-3-il) ethanone at a yield of 45%.

<Equation 11>

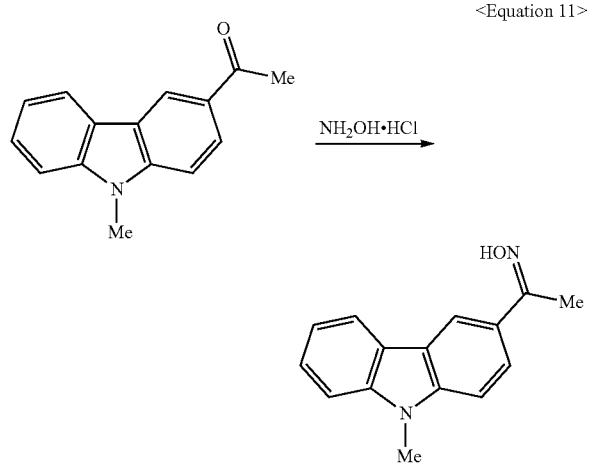

As represented by Equation 11, 1-(9-methyl carbazole-3-il)ethanone obtained from Equation 10 was reacted with $NH_2OH \cdot HCl$ at 20-70° C. for 3 hours in a NaOH/EtOH base system to synthesize 1-(9-methyl carbazole-3-il)ethanone oxime at a yield of 90%.

<Equation 12>

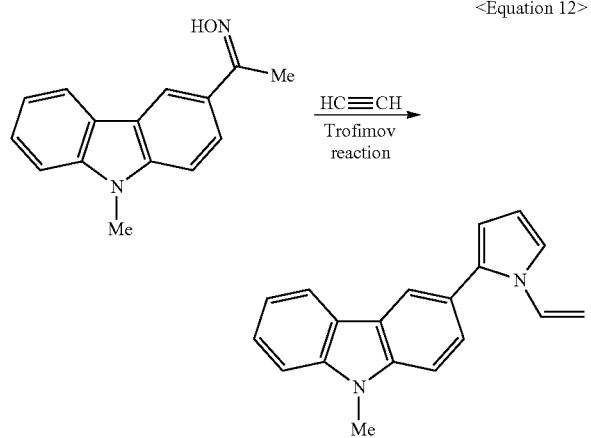

As represented in Equation 12, 9-methyl-3-(a-vinyl pyrrole-2-il)carbazole was manufactured at a yield of 56% by Trofiamov reaction of 1-(9-methyl carbazole-3-il)ethanone oxime obtained from Equation 11 with acetylene at 30 atmosphere of pressure, at 100° C., and for 2 hours in a KOH/DMSO base system.

The obtained 9-methyl-3-(1-vinyl pyrrole-2-il)carbazole was radically polymerized in the presence of AIBN at 65° C. for 18 hours to manufacture poly[9-methyl-3-(1-vinyl pyrrole-2-il)carbazole] having a molecular weight of 3,200 at a yield of 33%.

EXAMPLE 6

Synthesis of poly(1-vinyl-2-(1-anthracenyl)pyrrole) and 1-vinyl-2-(2-anthracenyl)pyrrole <Equation 13>

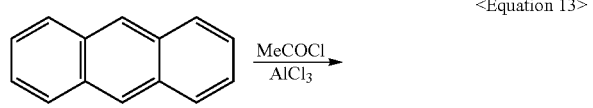

As represented in Equation 13, anthracene was reacted with MeCOCl at 0-5° C. for 2.5 hours in the presence of benzene and $AlCl_3$ to synthesize 9-acetyl anthracene at a yield of 40%.

<Equation 14>

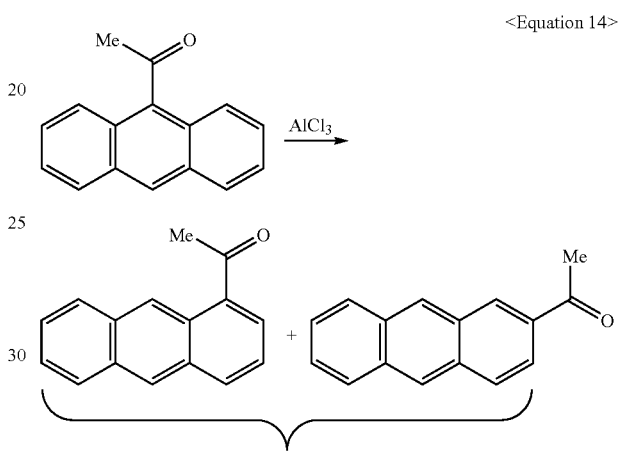

As represented by Equation 14, 9-acetyl anthracene was reacted in the presence of $AlCl_3$ and benzene-nitrobenzene at 40° C. for 5 hours to synthesize 1-acetyl anthracene and 2-acetyle anthracene at a yield of 10%.

The obtained 1-acetyl anthracene and 2-acetyl anthracene were respectively reacted with $NH_2OH \cdot HCl$ at 35-50° C. for 5 hours in a NaOH/EtOH base system to synthesize 1-anthracene-1-il-ethanone oxime and 2-anthracene-2-il-ethanone oxime at a yield of 37% and 42%.

2-anthracene-1-il-1-vinyl-1H-pyrrole and 2-anthracene-2-il-1-vinyl-1 H-pyrrole were manufactured at a yield of 42% and 33%, respectively, by Trofiamov reaction of the obtained 1-anthracene-1-il-ethanone oxime and 2-anthracene-2-il-ethanone oxime with acetylene at 30 atmosphere of pressure, at 100° C. and for 3 hours in a KOH/DMSO base system.

The obtained 2-anthracene-1-il-1-vinyl-1H-pyrrole and 2-anthracene-2-il-1-vinyl-1H-pyrrole were pressurized and radically polymerized at 65° C. for 15 hours in the presence of AIBN to manufacture poly(1-vinyl-2-(1-anthracene)pyrrole) and 1-vinyl-2-(2-anthracenenil)pyrrole having a molecular weight of 3,500 respectively at a yield of 33% and 42%.

EXPERIMENTAL EXAMPLE 1

Photoluminescence

Figure 3:
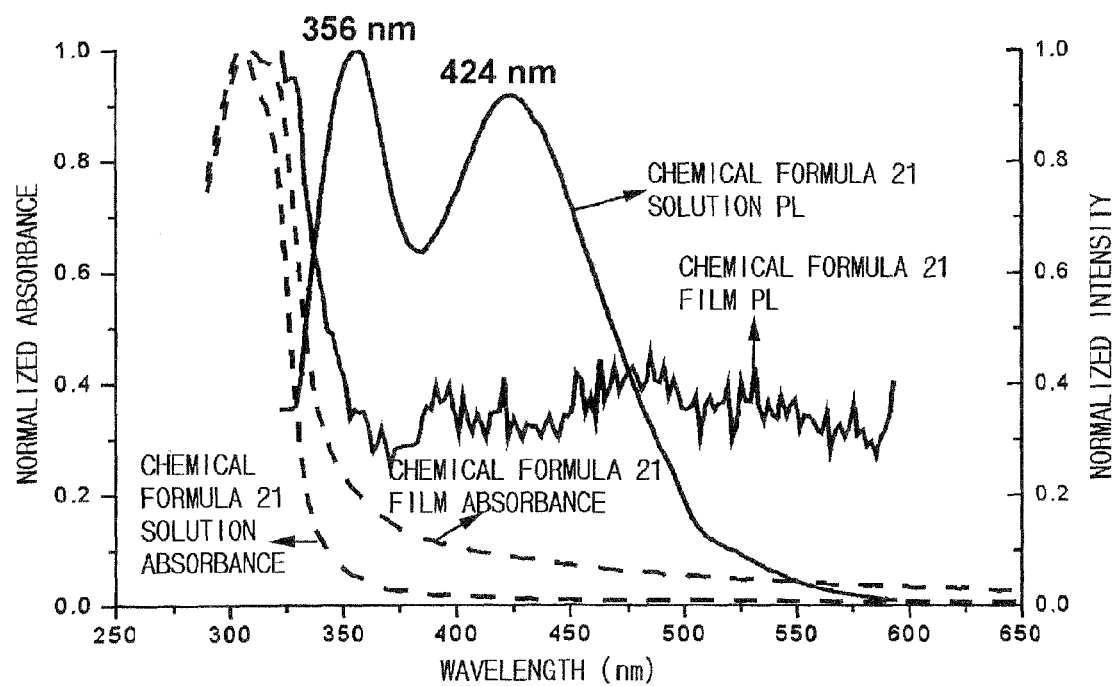
FIG. 3 illustrates an absorption spectrum and a PL spectrum of a polyvinyl pyrrole host obtained from Example 3.
Figure 4:
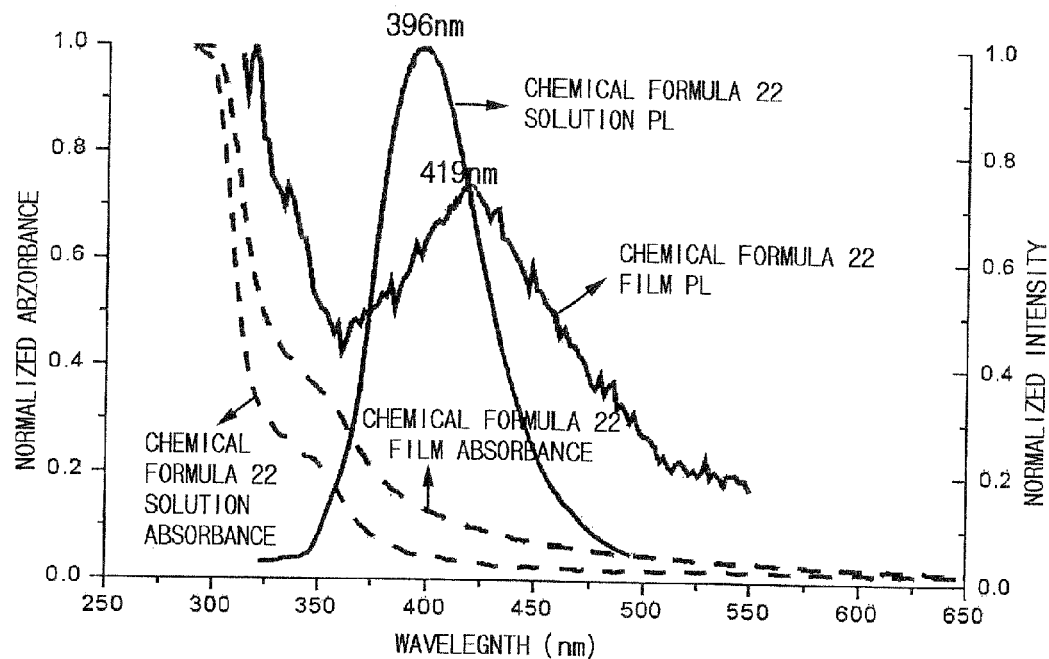
FIG. 4 illustrates an absorption spectrum and a PL spectrum of a polyvinyl pyrrole host obtained from Example 5.

Photoluminescence of poly(1-vinyl-4,5-dihydrobenzo[g]indole) of Formula 13 and poly(9-methyl-3-(1-vinyl pyrrole- 2-il)carbazole) of Formula 14 obtained in the above described manner was measured in the following manner: the above compounds were dissolved in methylene chloride and thus were made as $10^{-4}$ M solution, and then the photoluminescence of the compounds in the state of solution was measured. Also, the compounds were spin-coated and the photoluminescence of the compounds in the form of a film was measured and the result thereof is illustrated in FIGS. 3 and 4.

<Formula 13>

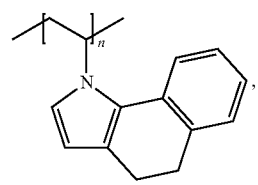

where n is an integer from 10 to 10,000.

<Formula 14>

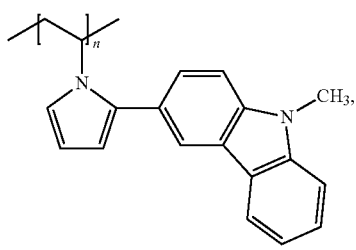

where n is an integer from 10 to 10,000.

It is evident from FIGS. 3 and 4 that the polyvinyl pyrrole host material according to an embodiment of the present invention has good phosphorescence and thus is appropriate as a phosphorescent material emitting light in the blue color region.

EXPERIMENTAL EXAMPLE 2

Measurement of Solubility

1% by weight of poly(1-vinyl indole) obtained from Experimental example 1 was put into various solvents to measure the solubility. The solvents may be toluene, CB, 1,4-dioxane, THF, o-xylene, diacetone, alcohol, PGMEA, DMF, DMSO, MeOH, chloroform, and benzene.

Also, the solubility of poly-1,4-bis-[2-(1-vinyl)-pyrrolyl]benzene with the above solvents was measured.

For example, 40 mg of poly(1-vinyl indole) was put into 4 ml of benzene and agitated at a normal temperature for 1 hour. Agitation was performed for 15 hours, a small amount of sediment was precipitated and the solution became clear. 1 ml (837 mg) of the transparent solution was taken to another container, and the rest of the film after benzene was evaporated, was dried at 70° C. in a vacuum of 2 mm Hg until the film gains a predetermined weight. As a result, the weight of the dried film was 6.3 mg. The solubility of poly(1-vinyl indole) to benzene was 0.75%, and the unmelting portion was about 0.25%.

Also, 30 mg of poly-1,4-bis-[2-(1-vinyl)-pyrrolyl]benzene was put into 3 ml of benzene and agitated at a normal temperature for 1 hour. Agitation was performed for 15 hours, a small amount of sediment was precipitated and the solution became clear. 1 ml (860 mg) of the transparent solution was taken to another container, and the rest of the film after benzene was evaporated, was dried at 70° C. in a vacuum of 2 mm Hg until the film gains a predetermined weight. As a result, the weight of the dried film was 7.75 mg. The solubility of poly-1,4-bis-[2-(1-vinyl)-pyrrolyl]benzene to benzene was 0.90%, and the unmelting portion was about 0.10%.

As evident from the solubility measurement result, the polyvinyl pyrrole host material according to an embodiment of the present invention can be dissolved in various solvents and can be applied to the substrate using various coating methods.

Fabrication of Organic Electroluminescent Display Devices

EXAMPLE 7

A transparent electrode substrate coated with indium-tin oxide (ITO) was cleansed thoroughly, and ITO was patterned using a photoresist resin and an etchant to form an ITO electrode pattern and was cleansed again. Then, PEDOT (poly(3,4-ethylenedioxythiophene)) [Al 4083] was coated on the resultant material to a thickness of 50 nm and baked at 120° C. for about 5 minutes to form a hole injection layer.

A composition for forming a luminescent layer, which is obtained by mixing 5 mg of dopant of Formula 15 and 95 mg of poly(1-vinyl-4,5-dihydrobenzo[g]indole) of Formula 13 to 10 g of m-xylene solution was spin coated on the upper portion of the hole injection layer and was baked at 100° C. for 1 hour, and then the solvent was removed completely to form a luminescent layer to a thickness of 50 nm [5% by weight of the dopant of Formula 15, 95% by weight of the compound of Formula 13].

<Formula 13>

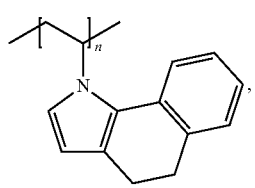

where n is an integer from 10 to 10,000.

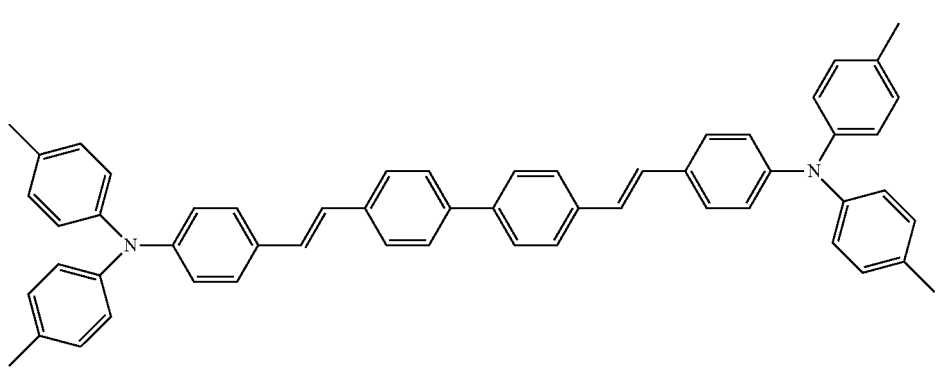

<Formula 15>

Next, an electron transporting layer to a thickness of 10 nm was formed on the polymer luminescent layer by vacuum-evaporating Alq3 using a vacuum evaporator, maintaining a vacuum degree of 4×10$^{-6}$ torr or less. Then, LiF was vacuum-evaporated at a speed of 0.1 Å/sec to form an electron injection layer to a thickness of 1 nm.

Then, Al was deposited at a speed of 10 Å/sec and an anode to a thickness of 250 nm was deposited and encapsulated to complete an organic electroluminescent display device. The encapsulation was performed so that BaO powder was put in a glove box under dry nitrogen gas and encapsulated with a metal can and finally treated with UV hardener.

Figure 2:
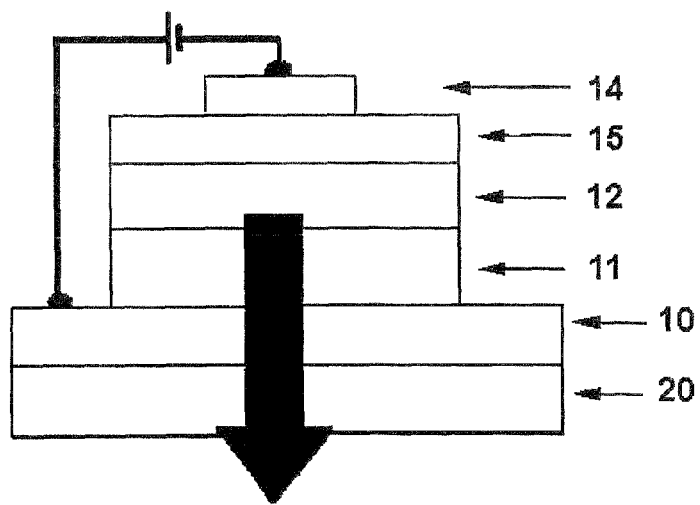
FIG. 2 is a schematic view of an organic electroluminescent display device manufactured according to an embodiment of the present invention.

The organic electroluminescent display device is a multilayer device and is schematically illustrated in FIG. 2, and the light emitting surface thereof is 6 mm$^2$.

EXAMPLE 8

An organic electroluminescent display device was manufactured in the same manner as Example 7, except that the luminescent layer in Example 7 contains 90% by weight of poly(1-vinyl-4,5-dihydrobenzo[g]indole) of Formula 13 and 10% by weight of the compound of Formula 15.

EXAMPLE 9

An organic electroluminescent display device was manufactured in the same manner as Example 7, except that poly (9-methyl-3-(1-vinyl pyrrole-2-il)carbazole) of Formula 14 was used in the luminescent layer of Example 7 instead of poly(1-vinyl-4,5-dihydrobenzo[g]indole) of Formula 13.

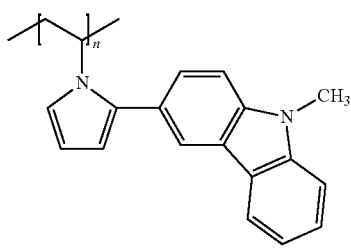

<Formula 14>

EXAMPLE 10

An organic electroluminescent display device was manufactured in the same manner as Example 9, except that the luminescent layer in Example 9 contains 90% by weight of poly(9-methyl-3-(1-vinyl pyrrole-2-il)carbazole) of Formula 14 and 10% by weight of the compound of Formula 15.

CIE (color coordinate), current efficiency, and driving voltage of each organic electroluminescent display device obtained from Examples 7 through 10 are illustrated in Table 1.

TABLE 1

| | CIE (x, y) | Current density (Cd/A @ V) | Driving voltage/ Op · V @ 100 cd/m$^2$ |
|---|---|---|---|
| Example 7 | (0.15, 0.19) | 2.5 @ 7.2 | 2.8/5.0 |
| Example 8 | (0.16, 0.21) | 3.0 @ 7.0 | 3.0/5.0 |
| Example 9 | (0.15, 0.21) | 2.5 @ 7.6 | 3.0/5.8 |
| Example 10 | (0.16, 0.23) | 3.8 @ 7.2 | 3.2/5.4 |

As evident from Table 1, each organic electroluminescent display device of Examples 7 through 10 employing the polyvinyl pyrrole host material according to an embodiment of the present invention shows great brightness in the blue light emitting region, can be driven at a low voltage, and has great current density at a low voltage.

The polyvinyl pyrrole host material according to an embodiment of the present invention can efficiently emit blue light and can be used to form a luminescent layer of an organic electroluminescent display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescence device, comprising:
   a first electrode;
   a second electrode; and
   a luminescent layer interposed between the first electrode and the second electrode, the luminescent layer comprising:
   a dopant; and
   a host material doped with the dopant, the host material represented by Formula 2 or 3:

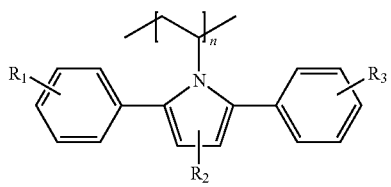
(2)

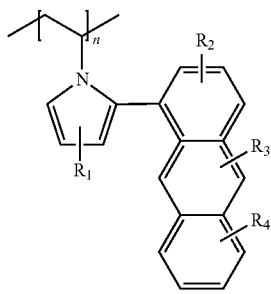
(4)

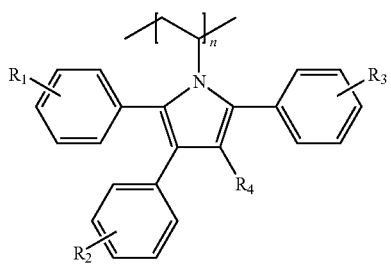
(5)

where $R_1$ and $R_3$ of Formula 2 are each independently a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ aryl alkyl group, a substituted or unsubstituted $C_5$-$C_{30}$ heteroaryl group, or a substituted or unsubstituted $C_3$-$C_{30}$ heteroarylalkyl group;

$R_2$ of Formula 2 is a cyano group, a substituted or unsubstituted $C_1$-$C_{20}$ heteroalkyl group, a substituted or unsubstituted $C_7$-$C_{30}$ aryl alkyl group, or a substituted or unsubstituted $C_3$-$C_{30}$ heteroarylalkyl group;

n is an integer from 10 to 10,000;

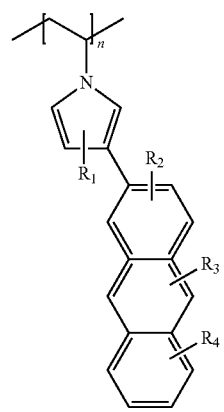
(3)

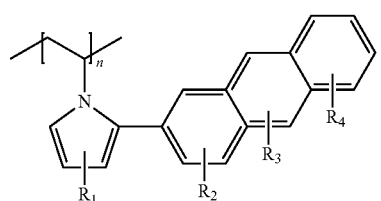
(6)

where $R_1$, $R_2$, and $R_3$ of Formula 3 are each independently a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ aryl alkyl group, a substituted or unsubstituted $C_5$-$C_{30}$ heteroaryl group, or a substituted or unsubstituted $C_3$-$C_{30}$ heteroarylalkyl group;

$R_4$ of Formula 3 is a halogen atom, a carboxyl group, an amino group, a nitro group, a cyano group, a substituted or unsubstituted $C_1$-$C_{20}$ heteroalkyl group, a substituted or unsubstituted $C_7$-$C_{30}$ arylalkyl group, or a substituted or unsubstituted $C_3$-$C_{30}$ heteroarylalkyl group; and n is an integer from 10 to 10,000.

2. An organic electroluminescence device, comprising:
a first electrode;
a second electrode; and
a luminescent layer interposed between the first electrode and the second electrode, the luminescent layer comprising:
a dopant; and
a host material doped with the dopant, the host material represented by Formulas 4 through 6:

where $R_2$, $R_3$, and $R_4$ are each independently a hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group;

$R_1$ is a cyano group, a substituted or unsubstituted $C_1$-$C_{20}$ heteroalkyl group, a substituted or unsubstituted $C_7$-$C_{30}$ arylalkyl group, or a substituted or unsubstituted $C_3$-$C_{30}$ heteroarylalkyl group; and n is an integer from 10 to 10,000.

3. An organic electroluminescence device, comprising:
a first electrode;
a second electrode; and
a luminescent layer interposed between the first electrode and the second electrode, the luminescent layer comprising:
a dopant; and
a host material doped with the dopant, the host material represented by one selected from the group consisting of Formulas 8 through 10 and 13:

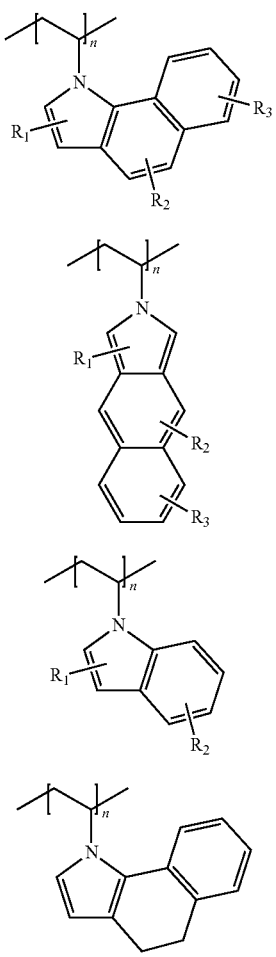

where $R_2$, and $R_3$ are each independently a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ aryl alkyl group, a substituted or unsubstituted $C_5$-$C_{30}$ heteroaryl group, or a substituted or unsubstituted $C_3$-$C_{30}$ heteroarylalkyl group;

$R_1$ is a cyano group, a substituted or unsubstituted $C_1$-$C_{20}$ heteroalkyl group, a substituted or unsubstituted $C_7$-$C_{30}$ arylalkyl group, or a substituted or unsubstituted $C_3$-$C_{30}$ heteroarylalkyl group; and n is an integer from 10 to 10,000.

4. The organic electroluminescence device of claim 1, wherein the host material is represented by Formula 2.

5. The organic electroluminescence device of claim 4, wherein $R_2$ of Formula 2 is a cyano group.

6. The organic electroluminescence device of claim 4, wherein $R_2$ of Formula 2 is a substituted or unsubstituted $C_1$-$C_{20}$ heteroalkyl group.

7. The organic electroluminescence device of claim 1, wherein the host material is represented by Formula 3.

8. The organic electroluminescence device of claim 7, wherein $R_4$ of Formula 3 is a cyano group.

9. The organic electroluminescence device of claim 7, wherein $R_4$ of Formula 3 is a substituted or unsubstituted $C_1$-$C_{20}$ heteroalkyl group.

10. The organic electroluminescence device of claim 2, wherein the host material is represented by Formula 4.

11. The organic electroluminescence device of claim 2, wherein the host material is represented by Formula 5.

12. The organic electroluminescence device of claim 2, wherein the host material is represented by Formula 6.

13. The organic electroluminescence device of claim 2, wherein $R_1$ is a cyano group.

14. The organic electroluminescence device of claim 2, wherein $R_1$ is a substituted or unsubstituted $C_1$-$C_{20}$ heteroalkyl group.

15. The organic electroluminescence device of claim 3, wherein the host material is represented by Formula 8.

16. The organic electroluminescence device of claim 3, wherein the host material is represented by Formula 9.

17. The organic electroluminescence device of claim 3, wherein the host material is represented by Formula 10.

18. The organic electroluminescence device of claim 3, wherein the host material is represented by Formula 13.

19. The organic electroluminescence device of claim 3, wherein $R_1$ is a cyano group.

20. The organic electroluminescence device of claim 3, wherein $R_1$ is a substituted or unsubstituted $C_1$-$C_{20}$ heteroalkyl group.

* * * * *